(12) United States Patent
Hunt et al.

(10) Patent No.: US 6,801,064 B1
(45) Date of Patent: Oct. 5, 2004

(54) BUFFER CIRCUIT USING LOW VOLTAGE TRANSISTORS AND LEVEL SHIFTERS

(75) Inventors: Jeffery Scott Hunt, Ackerman, MS (US); Scott Anthony Jackson, Starkville, MS (US)

(73) Assignee: Cypress Semiconductor, Corp, San Jose, CA (US)

( * ) Notice: Subject to any disclaimer, the term of this patent is extended or adjusted under 35 U.S.C. 154(b) by 0 days.

(21) Appl. No.: 10/228,436

(22) Filed: Aug. 27, 2002

(51) Int. Cl.[7] .................................................. H03B 1/00
(52) U.S. Cl. ...................... 327/112; 327/333; 326/63; 326/83
(58) Field of Search ................................ 327/333, 530, 327/437, 306, 108–112; 326/62, 63, 68, 80, 81–83, 85–87; 365/189.11, 189.09

(56) References Cited

U.S. PATENT DOCUMENTS

| | | | | |
|---|---|---|---|---|
| 5,300,832 A | * | 4/1994 | Rogers | 326/57 |
| 5,539,334 A | * | 7/1996 | Clapp et al. | 326/68 |
| 5,821,800 A | * | 10/1998 | Le et al. | 327/333 |
| 5,892,371 A | * | 4/1999 | Maley | 326/81 |
| 6,240,027 B1 | * | 5/2001 | Lee et al. | 365/189.11 |
| 6,292,025 B1 | * | 9/2001 | Okumura | 326/58 |
| 6,501,306 B1 | * | 12/2002 | Kim et al. | 327/112 |

* cited by examiner

Primary Examiner—Minh Nguyen
(74) Attorney, Agent, or Firm—Law Office of Dale B. Halling, LLC

(57) ABSTRACT

A buffer includes a pull-up level shifter coupled to an input signal. A pull-down level shifter separate from the pull-up level shifter is coupled to the input signal. A driver is coupled to the pull-up level shifter and the pull-down level shifter.

14 Claims, 3 Drawing Sheets

US 6,801,064 B1

BUFFER CIRCUIT USING LOW VOLTAGE TRANSISTORS AND LEVEL SHIFTERS

FIELD OF THE INVENTION

The present invention relates generally to the field of electronic circuits and more particularly to a buffer circuit.

BACKGROUND OF THE INVENTION

Semiconductor processing techniques are constantly improving and as they improve the required power supply voltages are reduced. The best semiconductor processing techniques today only require power supply voltages of around 1.8 volts. These processing techniques create transistors commonly referred to as thin oxide transistors. Thin oxide transistors are faster and can be used to produces denser circuits. Unfortunately, thin oxide circuits commonly have to interface with older technology circuits that have high voltage power supplies (e.g., 2.5V, 3.0V or 3.3V). These high voltage circuits contain transistors commonly referred to as thick oxide transistors. When it is necessary that a signal be transmitted from a low voltage thin oxide circuit to a high voltage, thick oxide circuit, a buffer circuit is required to convert the signal from a low voltage to a higher voltage; Prior art solutions use a buffer circuit that has both thick oxide transistors (components) and thin oxide transistors (components). As a result, the processing of these circuits is complex and expensive. Another problem with prior art circuits is that they have crowbar current. A crowbar current occurs when the output of the buffer circuit transitions and current flows directly from the power supply to ground.

Thus there exists a need for a buffer circuit that overcomes the problems of the prior art circuits.

SUMMARY OF INVENTION

A buffer circuit that overcomes these and other problems has a level translator circuit includes transistors having only thin oxides. A driver is coupled to the level translator circuit. The driver has transistors that are all thin oxide type transistors. The driver has a high voltage output. In one embodiment, the level translator circuit has a bias input and a data input. In another embodiment, the bias input includes a p-channel bias input and an n-channel bias input.

In one embodiment, the driver circuit includes a plurality of p-channel transistors coupled between a high voltage power supply and the high voltage output. In another embodiment, the driver circuit includes a plurality of n-channel transistors coup led between the high voltage output and a ground voltage.

The level translator circuit has a pull-up output signal and a pull-down output signal, in one embodiment. The pull-up output signal transitions off before the pull-down output signal transitions on when a data signal transitions from a high logic level to a low logic level, in one embodiment.

In one embodiment, the buffer circuit has a pull-up level shifter coupled to an input signal. A pull-down level shifter is coupled to the input signal. A driver is coupled to the pull-up level shifter and the pull-down level shifter. In one embodiment, the driver has a tri-state. In another embodiment, the driver does not have a crowbar current when an output of the driver transitions. In one embodiment, the pull-up level shifter is formed with transistors that are all thin oxide type transistors. In another embodiment, the output of the driver circuit has a high voltage output. In one embodiment, the driver has transistors that are all thin oxide type transistors. In another embodiment, the pull-up level shifter is coupled to a bias input signal. The pull-up level shifter is coupled to an enable input signal, in one embodiment.

In one embodiment, the buffer circuit has a first leg that contains a plurality of thin oxide transistors, coupled to a high voltage power supply. The first leg is coupled to an input signal. A second leg is symmetrical to the first leg and is coupled to the first leg at the high voltage power supply. The second leg has an output. In one embodiment, the first leg is coupled to a bias signal. In another embodiment, the second leg has a group of p-channel transistors coupled to the high voltage power supply and a group of n-channel transistors coupled between the p-channel transistors and a ground. The output of the second leg is coupled between the group of p-channel transistors and the group of n-channel transistors in one embodiment. One of the thin oxide transistors of the first leg is cross coupled with a transistor of the second leg in one embodiment.

DETAILED DESCRIPTION OF THE DRAWINGS

Figure 1:
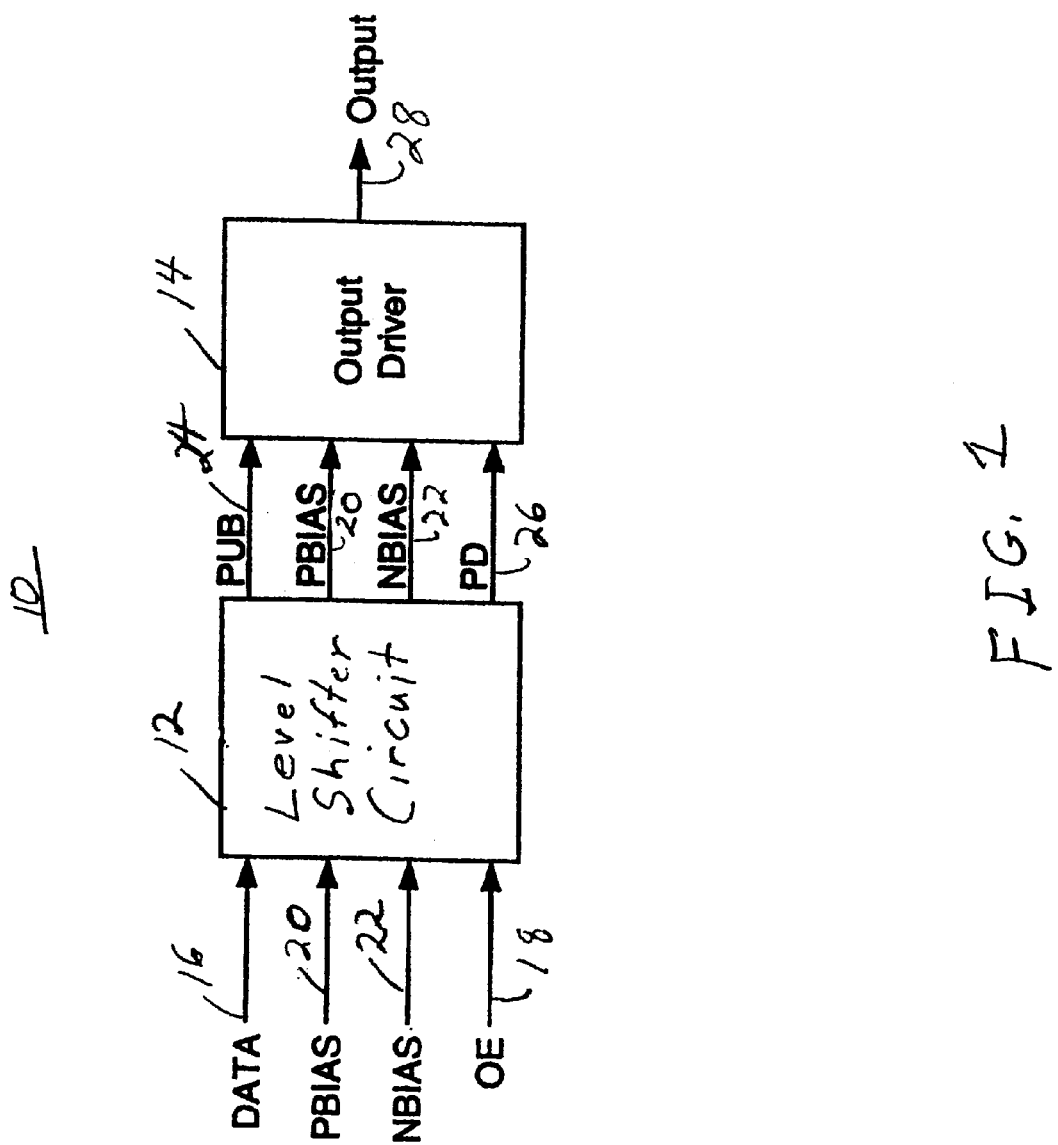
FIG. 1 is a block diagram of a buffer circuit in accordance with one embodiment of the invention.

FIG. 1 is a block diagram of a buffer circuit 10 in, accordance with one embodiment of the invention. The buffer circuit 10 has two main components a level shifter circuit 12 also known as a level translator circuit and an output driver 14. The level shifter circuit 12 has four inputs: a data input 16; an output enable signal 18; a p-channel bias input 20; and an n-channel bias input 22. Four signals couple the level shifter 12 to the output driver 14: a pull-up (PUB) signal 24; a pull-down (PD) signal 26; a p-channel bias input 20; and an in-channel bias input 22. The driver 14 has an output signal 28 that is a high voltage signal (e.g., 2.5, 3.0 or 3.3V). The data and the output enable signals are low voltage signals (e.g., 1.8 Volts). The output enable signal 18 is used to place the output driver 14 in a tri-state. The tri-state is when the output signal 28 is neither pulled high or pulled low but is allowed to float. This is useful when multiple buffer circuits are tied together in parallel. The p-channel bias input 20 is used to limit the voltage across the gate oxides of certain p-channel transistors. The n-channel bias input 22 is used to limit the voltage across the gate oxides of certain n-channel transistors. Note that it is possible to use the level shifter circuit 12 without the driver 14, however the performance of the buffer circuit will not be as good. In particular the transition times will be slower and crowbar current will exist when the output transitions.

Figures 2, 3:
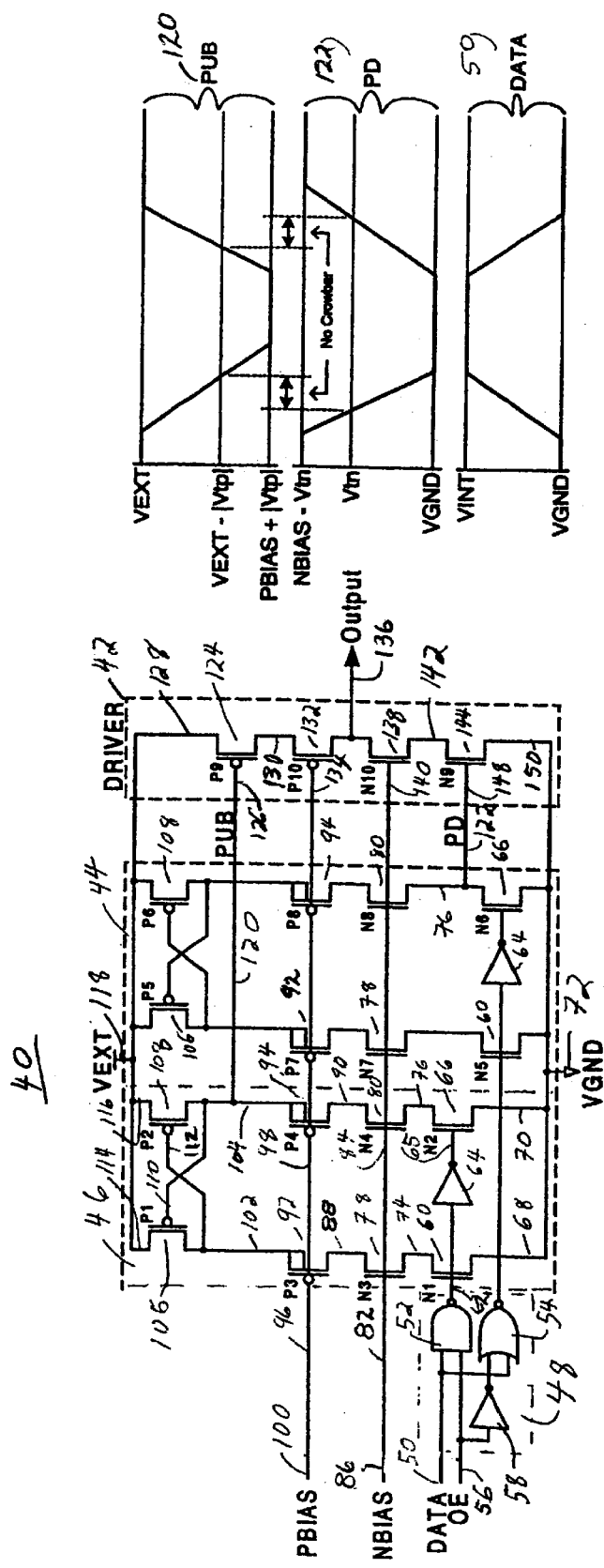
FIG. 2 is a schematic diagram of a buffer circuit in accordance with one embodiment of the invention.
FIG. 3 is a signal diagram of a set of selected signals of the buffer circuit of FIG. 2 in accordance with one embodiment of the invention.

FIG. 2 is a schematic diagram of a buffer circuit 40 in accordance with one embodiment of the invention. The circuit 40 has four sections: a driver 42; a pull-down level shifter 44, a pull-up level shifter 46; and a logic input circuit 48. A data input 50 is coupled to a NAND gate 52 of the logic input circuit 48 and a NOR gate 54. An output enable input 56 is coupled to the NAND gate 52 and an inverter 58.

The inverter 58 is coupled to an input of the NOR gate 54. The logic input circuit 48 allows the buffer circuit 40 to be placed in a tri-state.

The output of the NAND gate 52 is coupled to an n-channel transistor (N1) 60 of the pull-up level shifter 46. The gate 62 of the transistor 60 is coupled to the NAND gate 52 and to an inverter 64. The output of the inverter 64 is coupled to a gate 65 of an n-channel transistor (N2) 66. The sources 68, 70 of the transistors 60, 66 are coupled to ground 72. The drains 74, 76 of the transistors 60, 66 are coupled to the sources of n-channel transistors (N3, N4). 78, 80. The gates 82, 84 of the transistors 78, 80 are coupled to an n-channel bias input 86. The drains 88, 90 of the transistors 78, 80 are coupled to the drains of p-channel transistors (P3, P4) 92, 94. The gates 96, 98 of the transistors 92, 94 are coupled to the p-channel bias input 100. Note that the bodies of the transistors 92, 94 are coupled to the sources 102, 104 of the transistors 92, 94. This is not required, but has been found to improve the performance of the circuit in some cases. The sources 102, 104 of transistors 92, 94 are coupled to the drains of a pair of p-channel cross coupled transistors (P1, P2) 106, 108. The gate 110 of transistor 106 is coupled to the drain 104 of transistor 108. The gate 112 of transistor 108 is coupled to the drain 102 of transistor 106. The sources 114, 116 of transistors 106, 108 are coupled to a high voltage power supply (VEXT) 118. The pull-up signal 120 is coupled to the drain 104 of transistor 108.

The pull-down level shifter 44 has almost the same structure as the pull-up level shifter 46. As a result, only the differences will be explained and the same reference numerals will be used for similar parts of the circuit. One difference is that pull-down level shifter 44 is coupled to the output of the NOR gate 54 of the logic input circuit 48. The other major difference is that the output of the pull-down level shifter is a pull-down signal 122 that is coupled to the drain 76 of transistor 66 (N6).

The driver 42 has a p-channel transistor (P9) 124 that has a gate 126 coupled to the pull-up signal 120. The source 128 of the transistor 124 is coupled to the high voltage power supply 118. The drain 130 of the transistor 124 is coupled to the source of p-channel transistor (P10) 132. The gate 134 of transistor 132 is coupled to the p-channel bias input 100. The drain 136 of transistor 132 is coupled to the output 136 of the driver 42. The drain 136 of transistor 132 is coupled to the drain of n-channel transistor (N10) 138. The gate 140 of transistor 138 is coupled to the n-channel bias input signal 86. The source 142 of the transistor 138 is coupled to the drain of n-channel transistor (N9) 144. The gate 148 of the transistor 144 is coupled to the pull-down signal 122. The source 150 of the transistor 144 is coupled to ground 72.

Note that all the components shown in FIG. 2 are thin oxide components. The data input and output enable input are low voltage signals and the output is a high voltage signal. The bias: signal(s) 86, 100 are used to limit the voltage across the gate oxides of the transistors. Without this the gate oxide of the transistors would be stressed causing the transistors to eventually fail. In one embodiment, the bias signals are combined or have the same voltage.

When the data input 50 is high or a logic one, in one embodiment, the buffer circuit 40 has a high output 136. As a result the pull-up signal 120 is pulled low. This turns on the transistor 124 (P9) and transistor 132 (P110). The source 128 of transistor 124 is coupled to the high voltage power supply 118. In order to not stress the gate oxide of the transistor 124 (P9) the voltage of the pull-up signal 120 must be greater than VEXT 118 less the gate oxide limit. In order for the circuit to work the voltage of the pull-up signal 120 must be less than VEXT less a p-channel threshold drop plus the required gate overdrive. The minimum voltage of the pull-up signal 120 when the data signal 50 is high is equal to the voltage of the p-channel bias signal 100 plus a p-channel threshold voltage. This then defines the voltage range of the p-channel bias signal. The PBIAS voltage can range from a maximum level of VEXT less two p-channel thresholds less a gate overdrive to a minimum level of VEXT less the gate oxide limit. Note that the transistor (N2) 66 of the pull-up level shifter 46 is on when the data signal 50 is high and the transistor (N1) 60 is off. This results in the pull-up signal 120 having a voltage of the PBIAS input 100 plus a p-channel threshold. When the pull-up signal PUB 120 is pulled low the source to gate voltage of transistor 94 (P4) is pulled bellow a p-channel threshold, turning off transistor 94 (P4) so that the pull-up signal 120 stops pulling low.

The pull-down level shifter works similarly. When the data signal is low or a logical zero, transistor (N6) 66 is off and transistor (N9) 144 is on. In order to not stress the gate oxide of transistor (N9) 144 the pull-down signal 122 must be less than the gate oxide limit of the transistor but greater than an n-channel threshold and the required gate overdrive. This sets the voltage range for the pull-down signal. The NBIAS 86 signal may have a voltage range of a maximum voltage of VGND plus the gate oxide limit to a minimum voltage of VGND plus two n-channel thresholds plus the required gate overdrive. When the pull-down signal (PD) 122 transitions high, the gate to source voltage of transistor 80 (N8) is pulled below an n-channel threshold turning off transistor 80 (N8) so that the pull-down signal stops rising.

FIG. 3 is a signal diagram of a set of selected signals of the buffer circuit of FIG. 2 in accordance with one embodiment of the invention. These signal diagrams show how to properly set the bias signals 86, 100 so that no crowbar current occurs in the driver 42. The top signal 15 diagram shows the pull-up signal 120. The next signal diagram shows the pull-down signal 122 and the bottom signal diagram shows the data signal 50. As the data signal 50 transitions from low to high the pull-up signal 120 and the pull-down signal 122 transition low. The pull-up signal transitions from a voltage of VEXT to a voltage of PBIAS+1Vtpl. The transistor (P9) 124 turns on when the voltage reaches the value of VEXT−1Vtpl. The transistor (N9) 144 turns off when the pull-down signal reaches a voltage of Vtn. The pull-down signal 122 varies from a voltage of NBIAS−Vtn to VGND. Thus by selecting PBIAS and NBIAS correctly, the transistor (N9) 144 turns off before transistor (P9) 124 turns on when the data signal transitions from low to high. When the data transitions from high to low the transistor (P9) 124 turns off before the transistor (N9) 144 turns on. As a result, no crowbar current occurs in the driver 42.

When a tri-state is required, the data is not enabled. As a result the transistors (N2) 66 & (N5) 60 are off and transistors (N 1) 60 & (N6) 66 are on. This results in the p-channel transistor (P2) 108 being on and transistor (P6) 108 being off. As a result, the pull-up output 120 is high and the pull-down output 122 is low. This allows the drains 130, 142 of transistors (P9) 124, (N9) 144 to float and this allows the output 136 to float.

Figure 4:
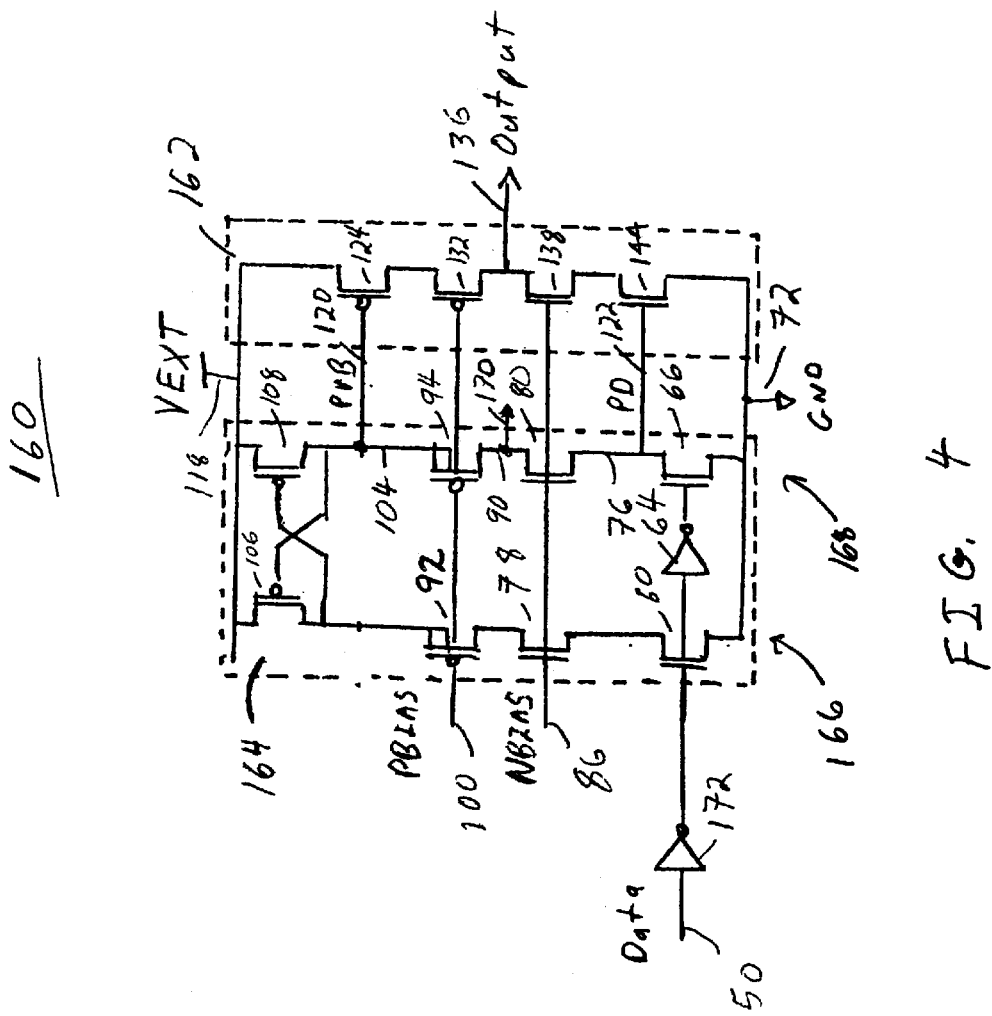
FIG. 4 is a schematic diagram of a buffer circuit in accordance with one embodiment of the invention.

FIG. 4 is a schematic diagram of a buffer circuit 160 in accordance with one embodiment of the invention. This embodiment of the buffer circuit is designed for use when the driver does not require a tri-state. The buffer circuit 160 has a driver 162 that is exactly like the driver 42 of FIG. 2 and the same reference numerals will be used in this figure for the driver. The driver 162 is coupled to a level translator circuit 164. The level translator circuit 164 has a first leg 166 that has a plurality of thin oxide transistors 60, 78, 92, 106. A second leg 168 of the circuit is symmetrical to the first leg 166. The second leg 168 has a pull-down signal 122 coupled to a drain 76 of the transistor 66 and a pull-up signal 120 coupled to a source 104 of transistor 94. The second leg has a group of p-channel transistors (94, 108) coupled to the high voltage power supply 118. The second leg also has a group of n-channel transistors (66, 80) coupled between the p-channel transistors and ground. Note that the level translator circuit 164 may be used without the driver circuit 162. In that case the output 170 is coupled to the drains of transistors 80, 94. When the tri-state is not required the logic input circuit 48 of FIG. 2 is simplified to become a single inverter 172 coupled to the data signal 50. In one embodiment, the two bias signal (PBIAS, NBIAS) 86, 100 may have the same voltage (or a single input). The embodiment shown in FIG. 4 may be built with transistors that are all thin oxide type transistors (low voltage) and may also be designed not to have any crowbar current.

Thus there has been described a buffer circuit that does not have a crowbar current and may be produced, with transistors that are all thin oxide type transistors (components).

While the invention has been described in conjunction with specific embodiments thereof, it is evident that many alterations, modifications, and variations will be apparent to those skilled in the art in light of the foregoing description accordingly, it is intended to embrace all such alterations, modifications, and variations in the appended claims.

What is claimed is:

1. An buffer circuit, comprising:
    a pull-up level shifter coupled to an input signal wherein the pull-up level shifter has a first p-channel transistor having a gate coupled to a drain of a second p-channel transistor and a gate of the second p-channel transistor coupled to a drain of the first n-channel transistor;
    a pull-down level shifter separate from the pull-up level shifter and coupled to the input signal; and
    a driver coupled to the pull-up level shifter and the pull-down level shifter, the driver having transistors that are all low voltage transistors, the driver having a high voltage output, wherein the low voltage transistors' gate oxide would be stressed if the high voltage signal was directly applied.

2. The buffer circuit of claim 1, wherein the pull-down level shifter has a bias input and a data input.

3. The buffer circuit of claim 2, wherein the bias input includes a p-channel bias input and an n-channel bias input.

4. The buffer circuit of claim 1, wherein the driver circuit includes a plurality of p-channel transistors coupled between a high voltage power supply and the high voltage output.

5. The buffer circuit of claim 4, wherein the driver circuit includes a plurality of n-channel transistors coupled between the high voltage output and a ground voltage.

6. The buffer circuit of claim 1, wherein the pull-down level shifter has a pull-down output signal.

7. The buffer circuit of claim 6, wherein a pull-up output signal transitions off before the pull-down output signal transitions on when a data signal transitions from a high logic level to a low logic level.

8. A buffer circuit, comprising:
    a pull-up level shifter coupled to an input signal;
    a pull-down level shifter coupled to the input signal that is separate from the pull-up level shifter, wherein the pull-down level shifter has a first p-channel transistor having a gate coupled to a drain of a second p-channel transistor and a gate of the second p-channel transistor coupled to a drain of the first p-channel transistor; and
    a driver coupled to the pull-up level shifter and the pull-down level shifter, the driver having a high voltage output and having transistors that are all low voltage transistors, wherein the low voltage transistors' gate oxide would be stressed if the high voltage signal was directly applied.

9. The buffer circuit of claim 8, wherein the driver has a tri-state.

10. The buffer circuit of claim 8, wherein the driver does not have a crowbar current when an output of the driver transitions.

11. The buffer circuit of claim 8, wherein the pulll-up level shifter is formed with transistors that are all low voltage transistors.

12. The buffer circuit of claim 11, wherein the output of the driver circuit has a high voltage output.

13. The buffer circuit of claim 8, wherein the pull-up level shifter is coupled to a bias input signal.

14. The buffer circuit of claim 13, wherein the pull-up level shifter is coupled to an enable input signal.

* * * * *